(12) United States Patent
Saimyoji

(10) Patent No.: US 10,306,039 B2
(45) Date of Patent: May 28, 2019

(54) ELECTRONIC DEVICE AND METHOD OF MANUFACTURING THE SAME

(71) Applicant: KYOCERA CORPORATION, Kyoto (JP)

(72) Inventor: Takeshi Saimyoji, Osaka (JP)

(73) Assignee: KYOCERA CORPORATION, Kyoto (JP)

( * ) Notice: Subject to any disclaimer, the term of this patent is extended or adjusted under 35 U.S.C. 154(b) by 0 days.

(21) Appl. No.: 15/738,896

(22) PCT Filed: Mar. 2, 2016

(86) PCT No.: PCT/JP2016/056439
§ 371 (c)(1),
(2) Date: Dec. 21, 2017

(87) PCT Pub. No.: WO2016/208224
PCT Pub. Date: Dec. 29, 2016

(65) Prior Publication Data
US 2018/0191883 A1 Jul. 5, 2018

(30) Foreign Application Priority Data
Jun. 24, 2015 (JP) .................. 2015-126505

(51) Int. Cl.
*H04M 1/18* (2006.01)
*H05K 7/00* (2006.01)
(Continued)

(52) U.S. Cl.
CPC .............. *H04M 1/18* (2013.01); *H05K 5/064* (2013.01); *H05K 7/00* (2013.01); *H05K 7/14* (2013.01); *H04M 1/0216* (2013.01)

(58) Field of Classification Search
CPC ...... H04M 1/18; H04M 1/0216; H05K 5/064; H05K 7/00
(Continued)

(56) References Cited

U.S. PATENT DOCUMENTS 9,349,969 B2 * 5/2016 Kwon ................. H01L 51/0097
2005/0225952 A1 * 10/2005 Takagi ................ H04M 1/0216
361/749

(Continued)

FOREIGN PATENT DOCUMENTS

JP 2011-010164 A 1/2011

OTHER PUBLICATIONS

International Search Report dated May 17, 2016, in corresponding International Application No. PCT/JP2016/056439.

*Primary Examiner* — Ayodeji O Ayotunde
(74) *Attorney, Agent, or Firm* — Duane Morris LLP

(57) ABSTRACT

An electronic device includes an FPC as an extending member which extends to connect a first region and a second region to each other and includes a first surface and a second surface facing away from each other, a first member located to abut on the first surface, and a second member located to abut on the second surface. The first member and the second member form in combination, a sealing region which surrounds a certain section of the extending member with a gap being located in part. The first region and the second region are watertightly separated from each other by a sealant located in the gap at least in the sealing region. The first member includes a through hole which allows communication between the gap and the outside.

9 Claims, 13 Drawing Sheets

(51) Int. Cl.
  *H05K 7/14* (2006.01)
  *H05K 5/06* (2006.01)
  *H04M 1/02* (2006.01)

(58) Field of Classification Search
  USPC .......................................... 455/575.1, 575.3
  See application file for complete search history.

(56) References Cited

U.S. PATENT DOCUMENTS

| | | | |
|---|---|---|---|
| 2010/0323770 A1* | 12/2010 | Chuang | G06F 1/1622 455/575.4 |
| 2014/0191638 A1* | 7/2014 | Nakao | H04M 1/0262 312/229 |

\* cited by examiner

ELECTRONIC DEVICE AND METHOD OF MANUFACTURING THE SAME

CROSS-REFERENCE TO RELATED APPLICATION

The present application is the National Phase of PCT International Application No. PCT/JP2016/056439, filed on Mar. 2, 2016, which claims priority under 35 U.S.C. 119 (a) to Japanese Patent Application No. 2015-126505, filed on Jun. 24, 2015. PCT International Application No. PCT/JP2016/056439 is entitled "Electronic Device and Method for Manufacturing Same", and Japanese Patent Application No. 2015-126505 is entitled "Electronic Device and Method of Manufacturing the Same". The content of which are incorporated by reference herein in their entirety.

FIELD

An embodiment of the present disclosure relates to an electronic device and a method of manufacturing the same.

BACKGROUND

An electronic device such as a portable terminal device may include a waterproof structure.

SUMMARY

An electronic device based on the present disclosure includes an extending member which extends to connect a first region and a second region to each other and includes a first surface and a second surface facing away from each other, a first member located to abut on the first surface of the extending member, and a second member located to abut on the second surface of the extending member. The first member and the second member form in combination, a sealing region which surrounds a certain section of the extending member with a gap from the extending member being located in part. The first region and the second region are watertightly separated from each other by a sealant located in the gap at least in the sealing region. The first member includes a through hole which allows communication between the gap and the outside.

DETAILED DESCRIPTION

A concept up or upper or down or lower mentioned in the description below does not mean absolute up or upper or down or lower but may mean relative up or upper or down or lower in terms of a shown position.

First Embodiment

An electronic device in a first embodiment based on the present disclosure will be described with reference to FIGS. 1 to 12.

Figure 1:
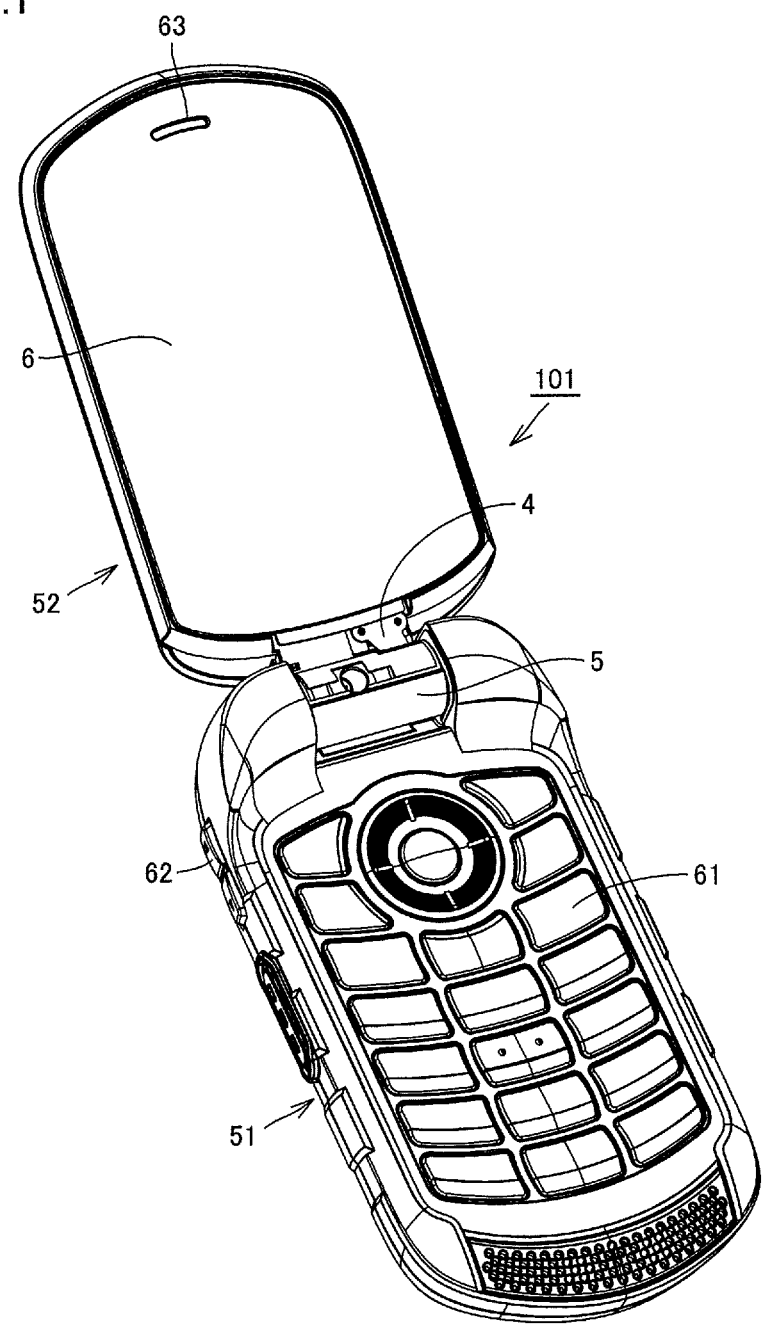
FIG. 1 is a perspective view of an electronic device in a first embodiment based on the present disclosure.

FIG. 1 shows appearance of an electronic device 101 in the first embodiment. Electronic device 101 is a foldable portable telephone. Though description is given here with a portable telephone being defined as the electronic device by way of example, the electronic device is not limited to the portable telephone. As shown in FIG. 1, electronic device 101 includes an operation portion 51 and a display 52. An operation key 61 is located in a front surface of operation portion 51. A volume key 62 is located in a side surface of operation portion 51. Display 52 includes a screen panel 6. A sound emission port 63 is located in a part of screen panel 6. Operation portion 51 and display 52 are connected to be foldable with a cylindrical portion 5 being interposed. FIG. 1 shows the electronic device with a component covering cylindrical portion 5 having been removed for the sake of convenience of illustration. In actual electronic device 101, cylindrical portion 5 is not necessarily exposed in a state as shown in FIG. 1.

Figure 2:
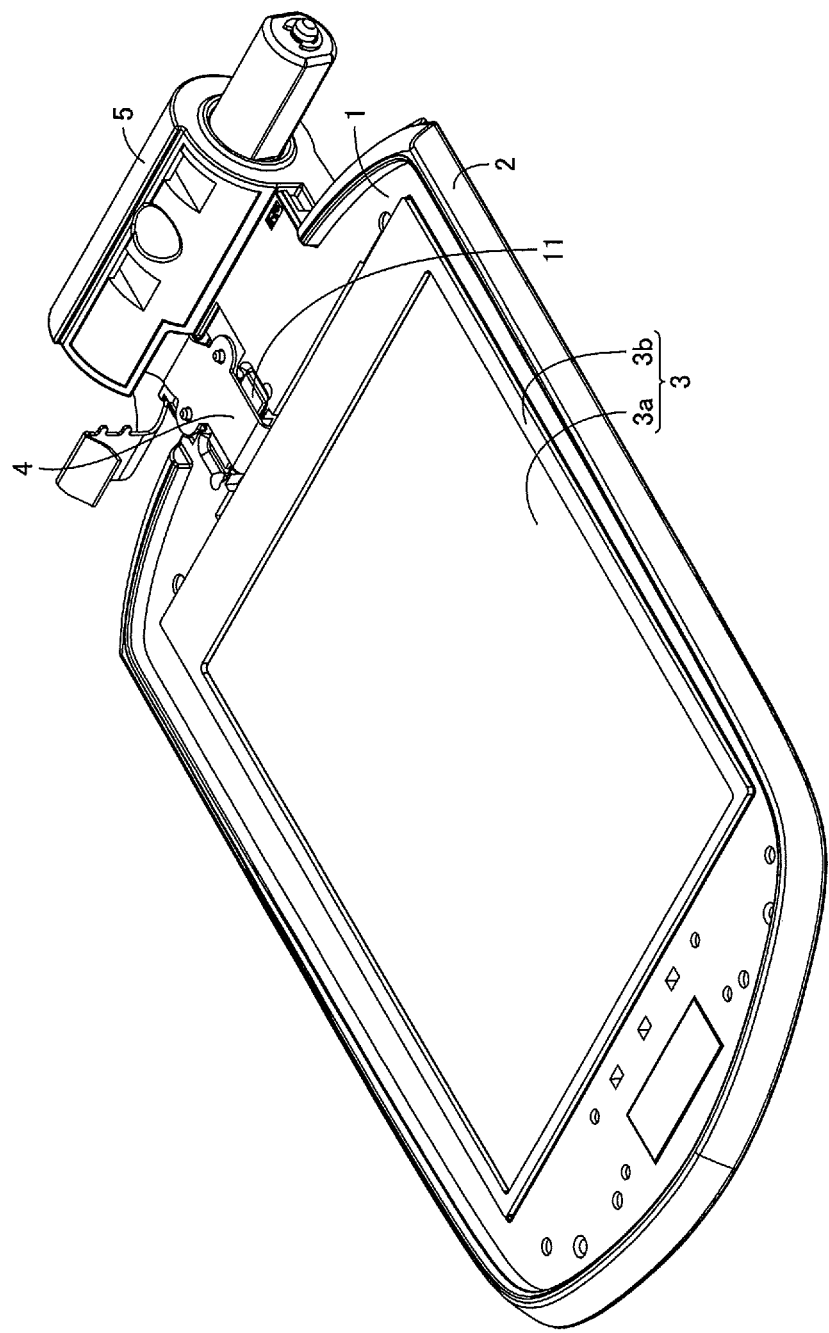
FIG. 2 is a perspective view of a part of the electronic device in the first embodiment based on the present disclosure as being extracted.

FIG. 2 shows a part of display 52 as being extracted. In FIG. 2, screen panel 6 has already been removed and a display panel 3 hidden under screen panel 6 is seen. Display panel 3 is held by a case 1. Case 1 includes an outer frame portion 2. Display panel 3 includes a display area 3a and a frame area 3b. Display panel 3 includes, for example, a liquid crystal display panel. A flexible printed circuit (FPC) 4 extends from display panel 3.

Figure 3:
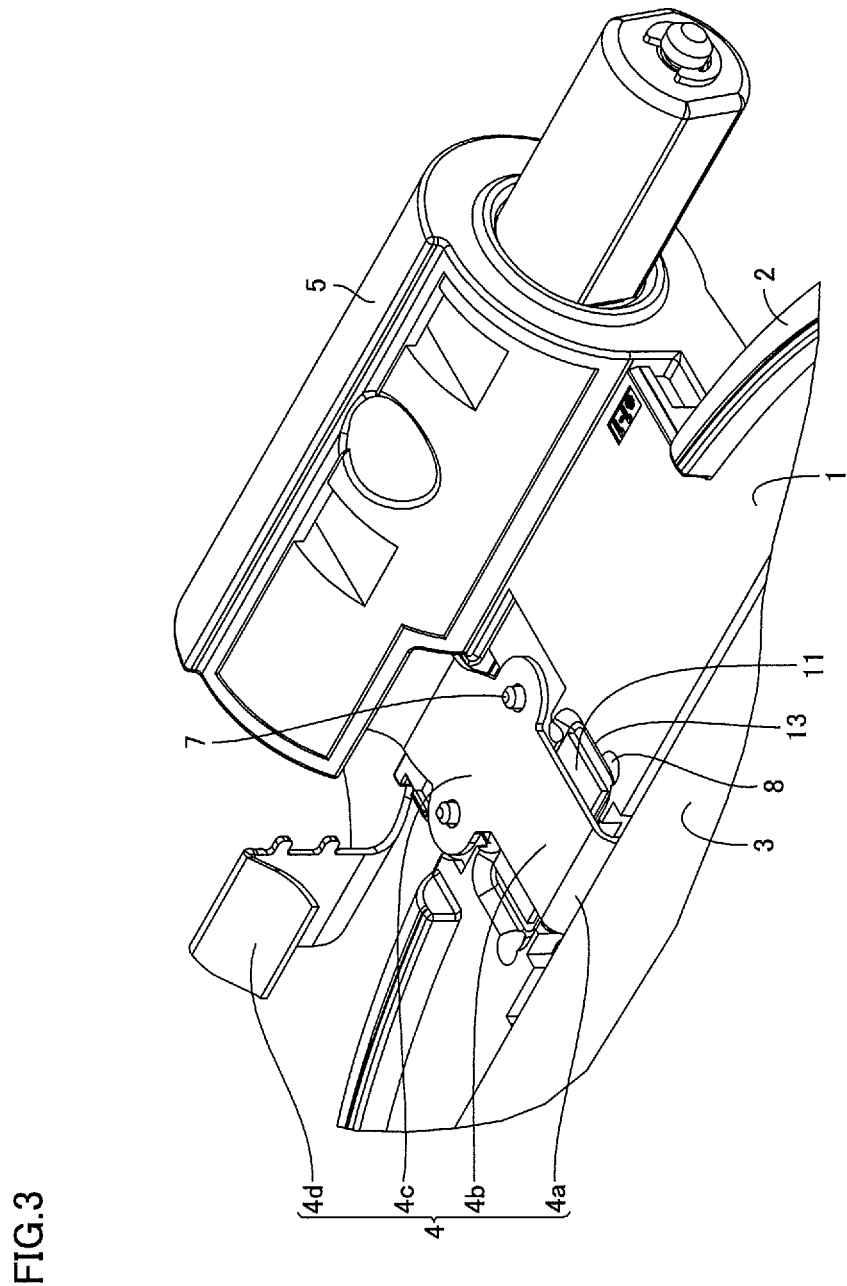
FIG. 3 is an enlarged view of the vicinity of an FPC shown in FIG. 2.

FIG. 3 shows the vicinity of FPC 4 shown in FIG. 2 as being enlarged. In the example shown here, FPC 4 includes a first portion 4a which directly extends from display panel 3, a flat second portion 4b, a third portion 4c which is flat and has an increased width, and a fourth portion 4d for connection to some device in operation portion 51. Third portion 4c includes a hole for passage of a protrusion 7. Protrusion 7 serves to fix a position of FPC 4. A portion between third portion 4c and fourth portion 4d passes through cylindrical portion 5.

Case 1 includes a recess 13. Second portion 4b of FPC 4 is superimposed on recess 13. There are through holes 8 at two locations in recess 13 where the through holes are not superimposed on second portion 4b. Through hole 8 passes through case 1. A waterproof sheet 11 is located under FPC 4. Waterproof sheet 11 is a sheet which is adhesive on opposing surfaces. Waterproof sheet 11 may be a waterproof double-faced tape.

Figure 4:
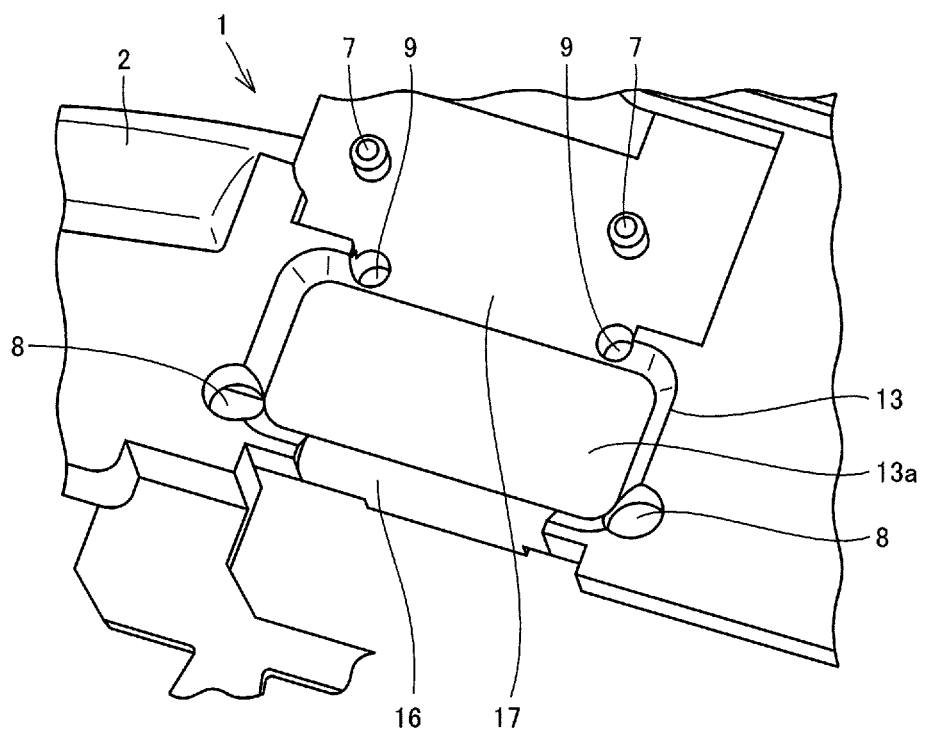
FIG. 4 is a perspective view of a part of a case included in the electronic device in the first embodiment based on the present disclosure as being extracted.

FIG. 4 shows a part of case 1 as being extracted. Case 1 includes recess 13. Recess 13 includes a bottom surface 13a. Waterproof sheet 11 shown in FIG. 3 is located on bottom surface 13a. Passages 16 and 17 for FPC 4 are located in two opposing sides of a portion surrounding recess 13. Passages 16 and 17 refer to portions lower than other portions so as to be able to receive FPC 4. As shown in FIG. 3, when FPC 4 extends across recess 13, FPC 4 passes through passages 16 and 17. Passages 16 and 17, however, are merely by way of example, and a shape thereof is not limited to the shape shown here.

As shown in FIG. 4, case 1 includes two through holes 8. Two through holes 8 communicate with recess 13. Case 1 further includes two check holes 9. Not only through holes 8 but also check holes 9 also pass through case 1. Case 1 includes two protrusions 7 at positions different from the position of recess 13.

Figure 5:
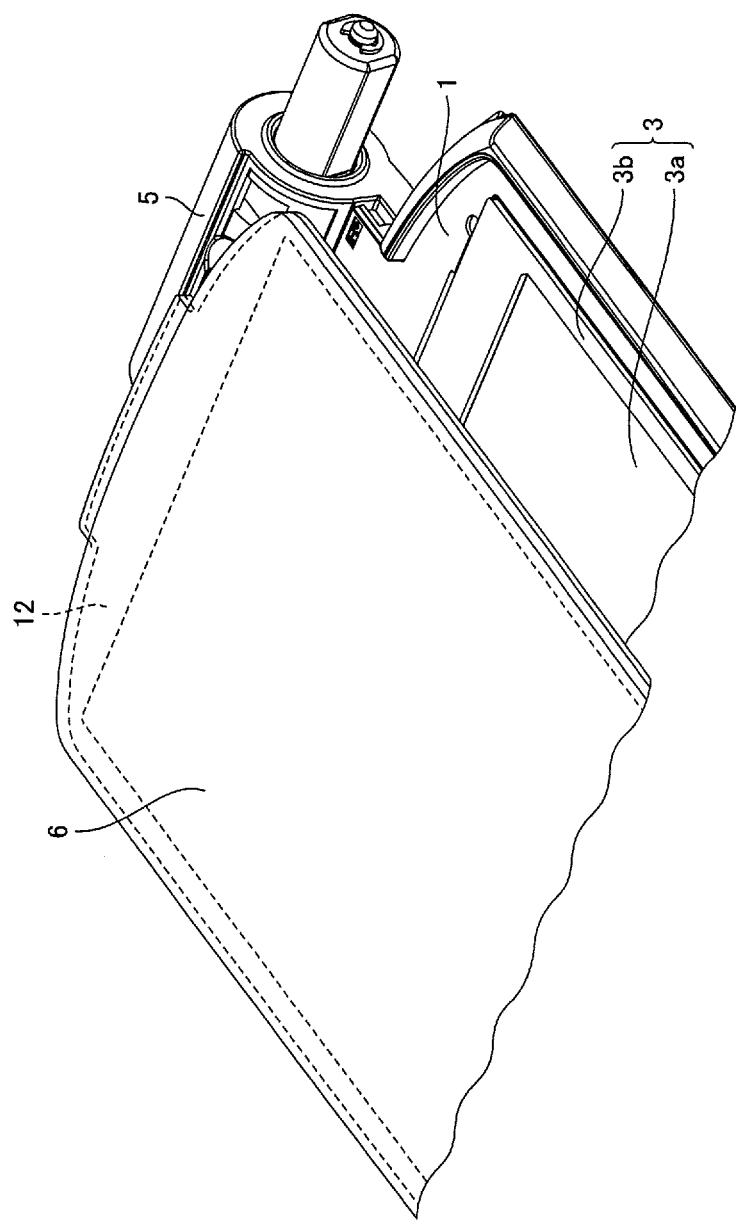
FIG. 5 is an exploded view of a part of the electronic device in the first embodiment based on the present disclosure.

FIG. 5 schematically shows attachment of screen panel 6 to case 1. Screen panel 6 is a transparent plate. A waterproof sheet 12 is bonded to a lower surface of screen panel 6. Waterproof sheet 12 is adhesive on opposing surfaces. In the example shown in FIG. 5, waterproof sheet 12 is located in a form of a frame along an outer perimeter of screen panel 6. For example, waterproof sheet 12 blocks light. When screen panel 6 is attached to case 1, display area 3a of display panel 3 is located inside waterproof sheet 12.

Figure 6:
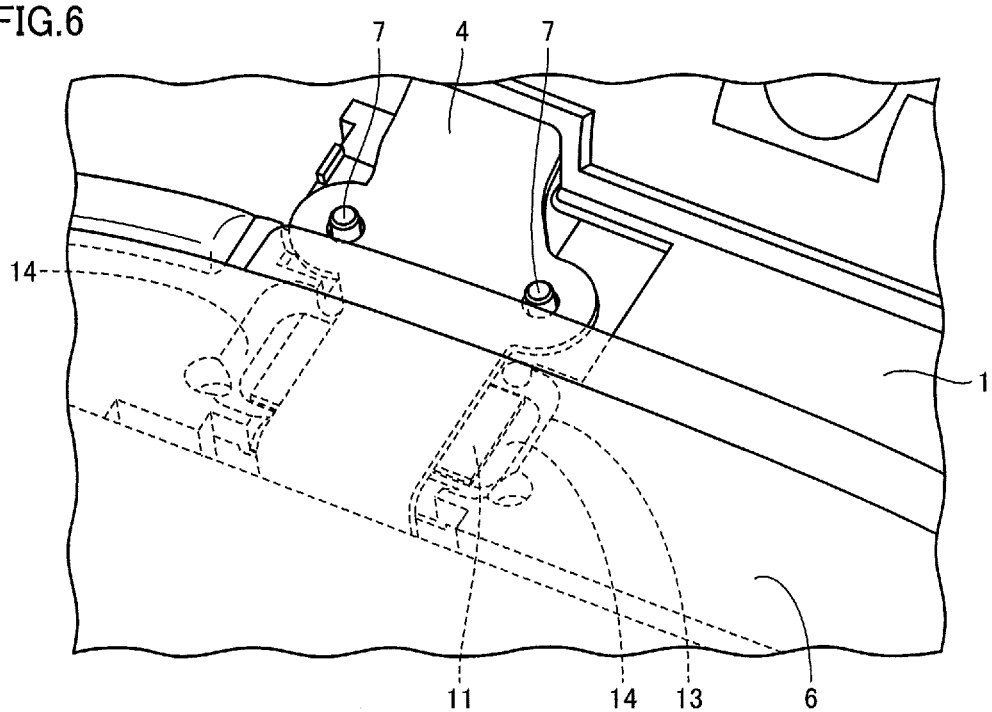
FIG. 6 is a perspective view of a part of the electronic device in the first embodiment based on the present disclosure.

FIG. 6 shows the vicinity of FPC 4 as being enlarged, with screen panel 6 being attached to case 1. Recess 13 is closed by screen panel 6. A portion of FPC 4 lying in recess 13 is covered with screen panel 6.

Figure 7:
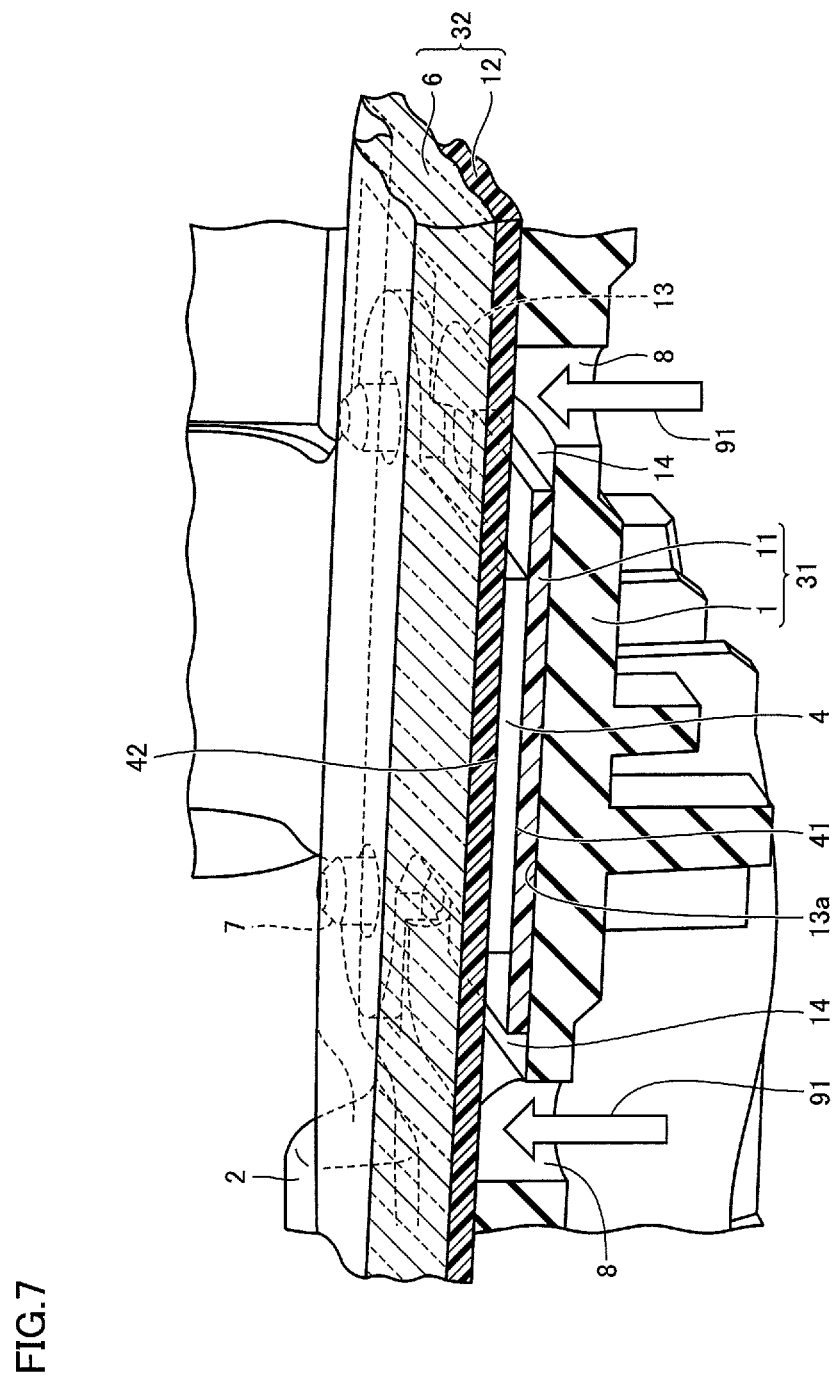
FIG. 7 is a perspective view of a cross-section of the part shown in FIG. 6.

FIG. 7 shows a perspective view of a cross-section in this state. Waterproof sheet 11 is located on bottom surface 13a of recess 13 in case 1 and FPC 4 is superimposed on waterproof sheet 11. Waterproof sheet 12 located on the lower surface of screen panel 6 is superimposed on FPC 4. FPC 4 is located between waterproof sheet 11 and waterproof sheet 12. A first member 31 includes case 1 and waterproof sheet 11. A second member 32 includes screen panel 6 and waterproof sheet 12. FPC 4 can also be described as lying between first member 31 and second member 32. As described with reference to FIG. 4, passages 16 and 17 are located in two sides of the portion surrounding recess 13 and FPC 4 passes through passages 16 and 17. Therefore, as shown in FIG. 7, the upper surface of FPC 4 is flush with the portion surrounding an outer perimeter of recess 13. Though the lower surface of second member 32 is flat in the example shown here, the lower surface of second member 32 simultaneously abuts on the upper surface of first member 31 and the upper surface of FPC 4.

The center of the internal space in recess 13 is closed as a result of passage of FPC 4 and a gap 14 is located on left and right thereof. Through hole 8 communicates with gap 14 from below case 1.

Figure 8:
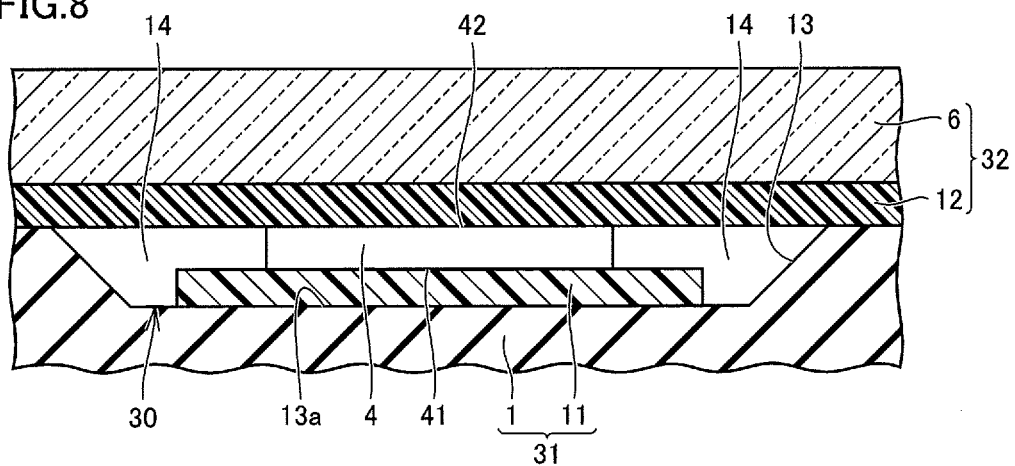
FIG. 8 is a cross-sectional view of a state of the part of the electronic device in the first embodiment based on the present disclosure before injection of a sealant.
Figure 9:
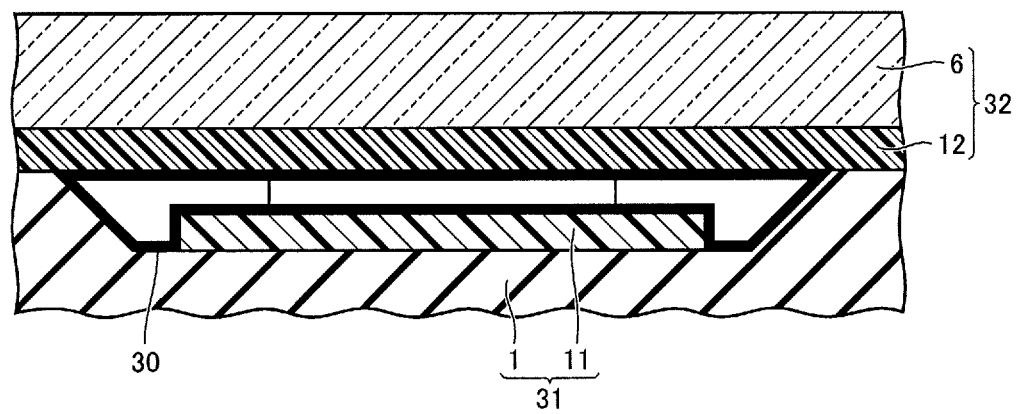
FIG. 9 is an illustrative view for specifying a sealing region in the electronic device in the first embodiment based on the present disclosure.
Figure 10:
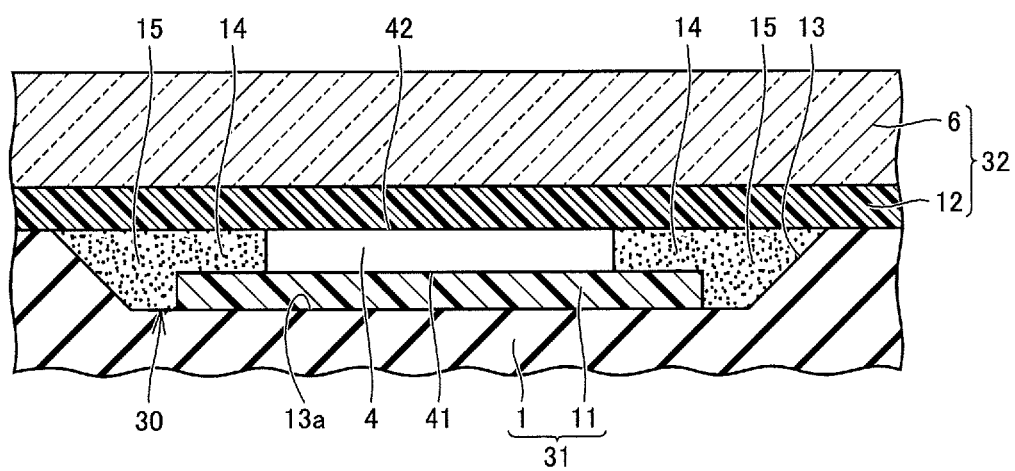
FIG. 10 is a cross-sectional view of a state of the part of the electronic device in the first embodiment based on the present disclosure after injection of the sealant.

FIG. 8 shows a cross-sectional view along a portion different from through hole 8. Gap 14 is located at left and right ends in the internal space in recess 13. Waterproof sheet 11 is greater in width than FPC 4. FIG. 8 shows a sealing region 30 which surrounds a certain section of FPC 4 with a gap from FPC 4 being located in part. FIG. 9 more clearly shows sealing region 30. Sealing region 30 is a three-dimensional region. In the cross-sectional view, sealing region 30 refers to a region surrounded by a bold line in FIG. 9. Gap 14 is a part of sealing region 30. FIGS. 6 to 9 show a state before injection of a sealant. Actually, before completion as electronic device 101, a sealant is injected through through hole 8. FIG. 10 shows a state after injection of a sealant 15 in gap 14.

Figure 11:
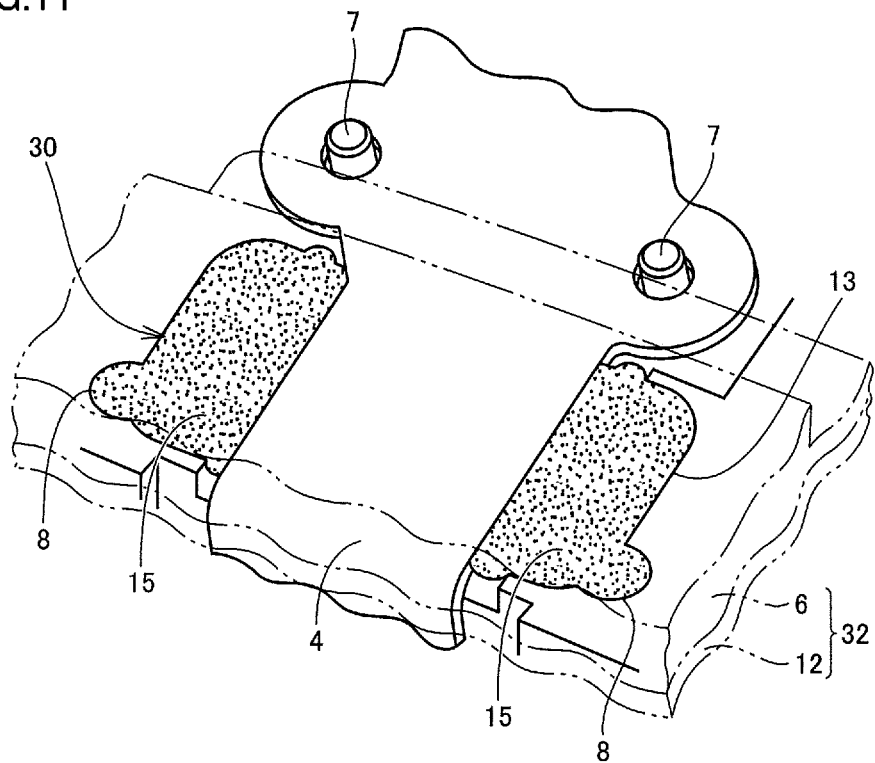
FIG. 11 is a perspective view of the state of the part of the electronic device in the first embodiment based on the present disclosure after injection of the sealant.

FIG. 11 shows a perspective view of a state after filling of gap 14 with sealant 15. In the example shown here, sealing region 30 corresponds to the entire recess 13 in a plan view. An upper surface of sealant 15 is flush with the upper surface of FPC 4. An extent of filling with sealant 15 shown here is merely by way of example and is not limited as such.

Figure 12:
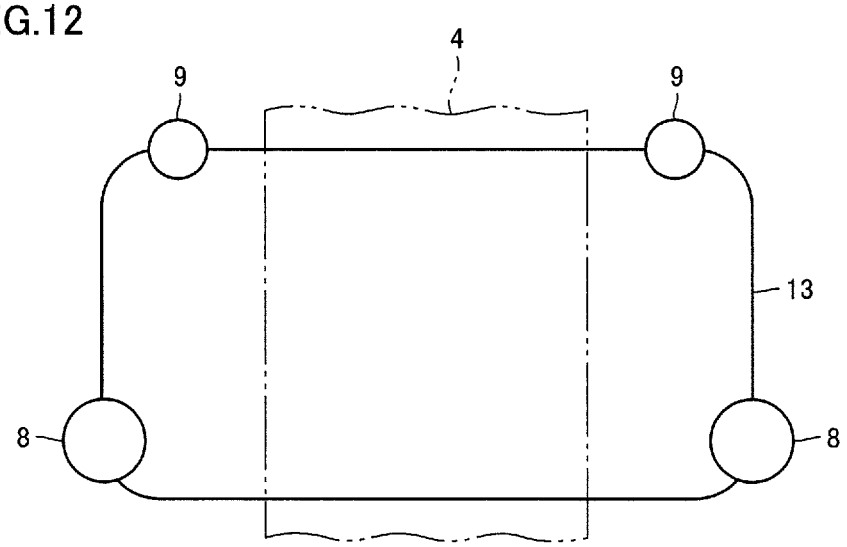
FIG. 12 is a plan view of a first example of the vicinity of a recess in the case of the electronic device in the first embodiment based on the present disclosure.

FIG. 12 shows positional relation of two through holes 8 and two check holes 9 with respect to recess 13 located in case 1 when recess 13 is two-dimensionally viewed. FIG. 12 also shows with a chain double dotted line, FPC 4 which extends across recess 13. Recess 13 is thus divided into two regions by FPC 4. At least one through hole 8 may be located in each region. At least one check hole 9 may be located in each region.

Though terms a "first region" and a "second region" are also used below, in the example shown in the first embodiment, a region on an inner side surrounded by waterproof sheet 12 when display 52 is two-dimensionally viewed corresponds to the "first region." The first region corresponds to a region in the inside of display 52 where a level of waterproofness is high. For example, display panel 3 is located in the first region. A region on an outer side of waterproof sheet 12 when display 52 is two-dimensionally viewed corresponds to the "second region." The second region refers to a region low in level of waterproofness. For example, no measures against water may be taken for the second region.

Electronic device 101 in the first embodiment includes FPC 4 as an extending member which extends to connect the first region and the second region to each other and includes a first surface 41 and a second surface 42 facing away from each other, first member 31 located to abut on first surface 41 of FPC 4, and second member 32 located to abut on second surface 42 of FPC 4. First member 31 and second member 32 form in combination, sealing region 30 surrounding a certain section of FPC 4 with a gap from FPC 4 as the extending member being located in part. The first region and the second region are watertightly separated from each other by sealant 15 located in gap 14 at least in sealing region 30. First member 31 includes through hole 8 which allows communication between gap 14 and the outside.

Though FPC 4 is adopted as one example of the extending member, the extending member is not limited to FPC 4 but another component may be applicable. The extending member may be, for example, some kind of a cable. The extending member may be a bundle of a plurality of cables. Though the extending member may be in a form of a plate like FPC 4, it is not necessarily in a form of a plate. Since the extending member extends to connect the first region and the second region to each other, it may normally be in a longitudinal shape, however, it is not necessarily in a longitudinal shape.

Though the entire three-dimensional space defined as gap 14 may be filled with sealant 15, the entire space does not necessarily have to be filled therewith. Sealant 15 may partially occupy gap 14. Sealant 15 in gap 14 should only separate the first region and the second region from each other to such an extent as blocking movement of water between the first region and the second region. Sealant 15 may extend off from gap 14 and may enter also through hole 8.

In the first embodiment, sealing region 30 surrounds a certain section of FPC 4 and the first region and the second region are watertightly separated from each other by sealant 15 at least in sealing region 30. Therefore, levels of waterproofness different between the first region and the second region can be maintained. Since through hole 8 which allows communication with the outside is located in gap 14 where sealant 15 is located, sealant 15 can readily be injected through through hole 8.

Since sealant 15 can be located in gap 14 by injection through through hole 8, first member 31 and second member 32 can be combined prior to injection of sealant 15. By combining first member 31 and second member 32 with each other, FPC 4 as the extending member lies therebetween and a position thereof is fixed. Therefore, the extending member can be prevented from undesirably being moved. Since sealant 15 can be injected through through hole 8 after first member 31 and second member 32 are combined with each other, such a situation as introduction of the sealant in a gap between undesired components can also be avoided. The electronic device in the first embodiment can thus solve various problems in assembly associated with the sealant.

At least one of the first member and the second member includes a recess and the sealing region may be formed in the recess. By adopting this construction, the extending member can reliably be received by making use of the recess. For example, in the first embodiment, at least one of first member 31 and second member 32, first member 31, includes recess 13, and sealing region 30 is formed in recess 13. Recess 13 is located on a side of first member 31 and a side of second member 32 is flat here. In contrast, some kind of recess may be located on the side of second member 32 and the side of first member 31 may be flat. Alternatively, a recess may be located in both of the first member and the second member.

The first member may include a first member main body and a first sheet interposed between the first member main body and the extending member. By adopting the construction, materials different for the first member main body and the first sheet can be selected as appropriate. A member in direct contact with the extending member in the first member is mainly the first sheet. Selection of a material or a shape of the first sheet is broadened and more appropriate waterproofness can be achieved. For example, in the first embodiment, first member 31 includes case 1 and waterproof sheet 11, and case 1 corresponds to the first member main body and waterproof sheet 11 corresponds to the first sheet.

The second member may include a second member main body and a second sheet interposed between the second member main body and the extending member. By adopting the construction, materials different for the second main body and the second sheet can be selected as appropriate. A member in direct contact with the extending member in the second member is mainly the second sheet. Selection of a material or a shape of the second sheet is broadened and more appropriate waterproofness can be achieved. For example, in the first embodiment, second member 32 includes screen panel 6 and waterproof sheet 12, and screen panel 6 corresponds to the second member main body and waterproof sheet 12 corresponds to the second sheet.

Through hole 8 may be a hole for injection of sealant 15 into gap 14 after first member 31 and second member 32 are combined with each other to surround FPC 4 as the extending member.

Figure 13:
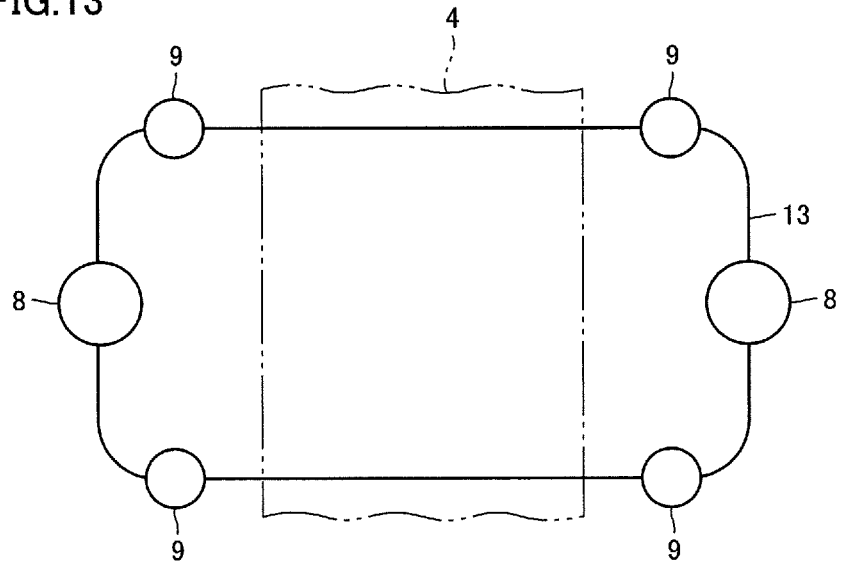
FIG. 13 is a plan view of a second example of the vicinity of the recess in the case of the electronic device in the first embodiment based on the present disclosure.

As already shown in FIG. 12, recess 13 is substantially rectangular. In the first embodiment, substantially the entire recess 13 corresponds to sealing region 30 in a plan view. In addition to the arrangement as shown in FIG. 12, arrangement shown in FIG. 13 is also applicable. When it is assumed that substantially the entire recess 13 corresponds to sealing region 30 also in FIG. 13, the following is applicable. In a plan view, an outer geometry of sealing region 30 is in a rectangular shape with a long side and a short side, FPC 4 as the extending member extends across the center of sealing region 30 in parallel to the short side, and through hole 8 may be located in an intermediate portion of the short side. By adopting the construction, sealant 15 injected through through hole 8 can spread from the intermediate portion of the short side to opposing sides in gap 14 and hence the entire gap 14 can efficiently be filled with the sealant.

Though a construction with check hole 9 is described in the first embodiment, check hole 9 itself is not essential. At least one of first member 31 and second member 32 may include check hole 9 for checking a condition of filling with sealant 15, separately from through hole 8. By adopting the construction, whether or not sealant 15 has normally been injected can visually externally be checked. In particular, if sealant 15 is clearly different in color from first member 31 or second member 32, checking through check hole 9 is facilitated.

As shown in FIG. 13, check hole 9 may be located in the vicinity of each vertex of the rectangle in a plan view. With such arrangement of check hole 9, whether or not the rectangle has sufficiently been filled with sealant 15 to the corners can externally readily be checked.

Second Embodiment

A method of manufacturing an electronic device in a second embodiment based on the present disclosure will be described with reference to FIG. 14.

Figure 14:
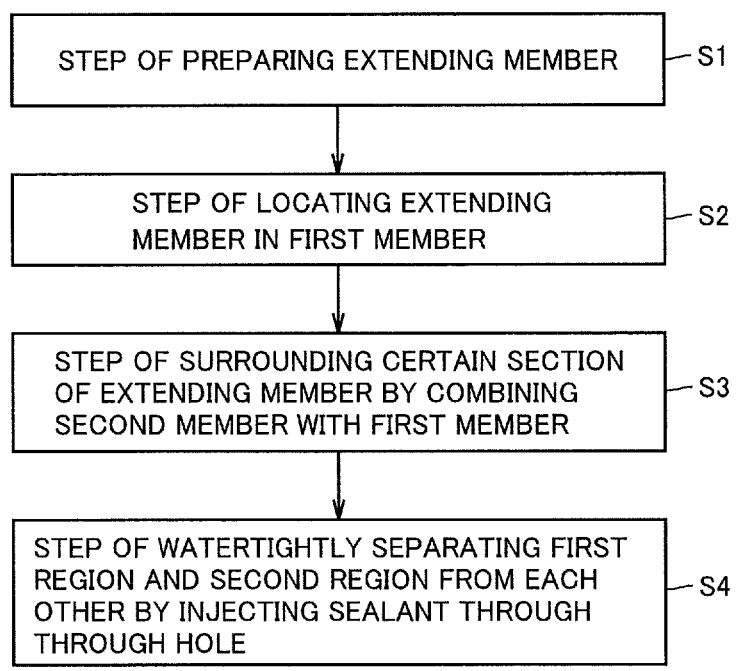
FIG. 14 is a flowchart of a method of manufacturing an electronic device in a second embodiment based on the present disclosure.

FIG. 14 shows a flowchart of the method of manufacturing an electronic device in the second embodiment. The method of manufacturing an electronic device includes a step S1 of preparing the extending member in a form of a thin plate which extends to connect the first region and the second region to each other and includes the first surface and the second surface facing away from each other, a step S2 of locating the extending member in the first member such that the first member abuts on the first surface of the extending member, a step S3 of surrounding a certain section of the extending member with a gap from the extending member being located in part by combining the second member with the first member such that the second member abuts on the second surface of the extending member, and a step S4 of watertightly separating the first region and the second region from each other by injecting the sealant into the gap through the through hole located in the first member which allows communication between the gap and the outside.

Each step will be described in detail with reference to a relevant figure as necessary.

Figure 15:
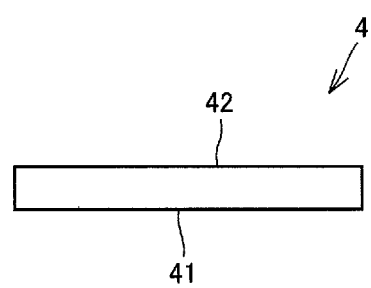
FIG. 15 is an illustrative view of a first step of the method of manufacturing an electronic device in the second embodiment based on the present disclosure.

Initially, in step S1, the extending member in a form of a thin plate which extends to connect the first region and the second region to each other and includes the first surface and the second surface facing away from each other is prepared. The extending member is, for example, FPC 4 shown in FIG. 3. FPC 4 includes first surface 41 and second surface 42 facing away from each other as shown in FIG. 15.

Figure 16:
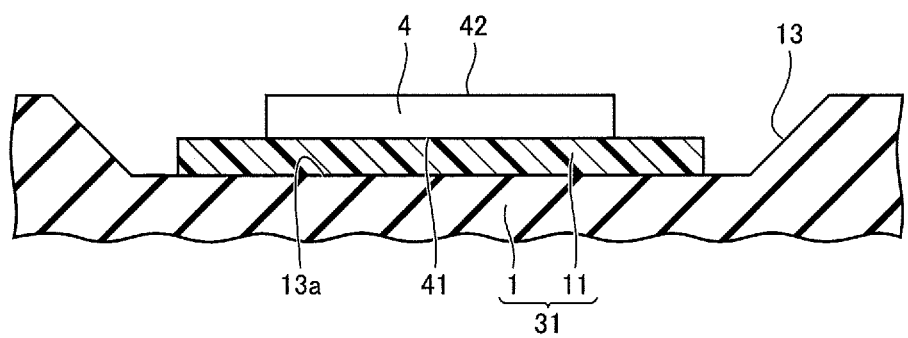
FIG. 16 is an illustrative view of a second step of the method of manufacturing an electronic device in the second embodiment based on the present disclosure.

In step S2, as shown in FIG. 16, FPC 4 as the extending member is located in first member 31 such that first member 31 abuts on first surface 41 of FPC 4.

Figure 17:
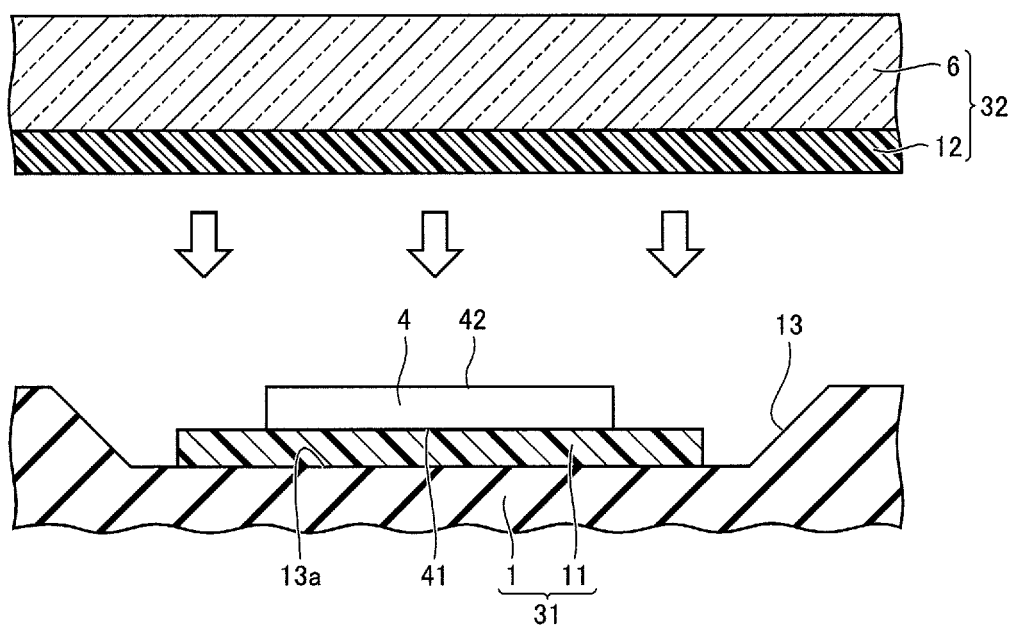
FIG. 17 is an illustrative view of a third step of the method of manufacturing an electronic device in the second embodiment based on the present disclosure.

FIG. 17 shows step S3 and FIG. 5 shows the perspective view corresponding thereto. As a result of step S3, the structure shown in FIG. 8 is obtained. FIG. 6 shows the perspective view of this state. In step S3, the certain section of FPC 4 is surrounded with gap 14 from FPC 4 being located in part by combining second member 32 with first member 31 such that second member 32 abuts on second surface 42 of FPC 4 as the extending member.

In step S4, the first region and the second region are watertightly separated from each other by injecting the sealant in gap 14 through through hole 8 located in first member 31 which allows communication between gap 14 and the outside. FIG. 7 shows injection of the sealant in step S4 with an arrow 91. As step S4 is completed, the structure shown in FIG. 10 is obtained. By the time of end of step S4, gap 14 is filled with sealant 15.

By further performing other necessary steps including such steps S1 to S4 as appropriate, an electronic device can be manufactured. For example, electronic device 101 as shown in FIG. 1 can be obtained.

According to the method of manufacturing an electronic device in the second embodiment, an electronic device can be manufactured with various problems in assembly associated with the sealant having been solved. Therefore, in such a structure that the extending member extends to connect the first region and the second region to each other, the extending member and peripheral components can be located while good waterproofness is ensured.

Some features described in embodiments above may be adopted as being combined as appropriate.

Though description has been given so far by using the term "electronic device," the electronic device is a broad concept covering, for example, a portable telephone, a portable information terminal, a tablet terminal, a personal computer, a game console, a television receiver, a portable music player, a CD player, a DVD player, an electronic dictionary, an electronic book reader, a digital camera, a video camera, a radio receiver, and a navigation system. The concept of the portable telephone or the portable information terminal includes a smartphone.

Embodiments disclosed herein are illustrative and non-restrictive in every respect. The scope of the present disclosure is defined by the terms of the claims and is intended to include any modifications within the scope and meaning equivalent to the terms of the claims.

The invention claimed is:

1. An electronic device comprising:
an extending member which extends to connect a first region and a second region to each other and includes a first planar surface and a second planar surface facing away from each other;
a first member immovably fixed to the first planar surface of the extending member; and
a second member immovably fixed to the second planar surface of the extending member,
the first member and the second member forming in combination, a sealing region which surrounds a certain section of the extending member with a gap from the extending member being located in part,
the first region and the second region being watertightly separated from each other by a sealant located in the gap at least in the sealing region, and
the first member including a through hole which allows communication between the gap and outside.

2. The electronic device according to claim 1, wherein at least one of the first member and the second member includes a recess and the sealing region is formed in the recess.

3. The electronic device according to claim 1, wherein the first member includes a first member main body and a first sheet interposed between the first member main body and the extending member.

4. The electronic device according to claim 1, wherein the second member includes a second member main body and a second sheet interposed between the second member main body and the extending member.

5. The electronic device according to claim 1, wherein the through hole is a hole for injection of the sealant into the gap after the first member and the second member are combined with each other to surround the extending member.

6. The electronic device according to claim 5, wherein an outer geometry of the sealing region is in a rectangular shape with a long side and a short side in a plan view, the extending member extends across a center of the sealing region in parallel to the short side, and the through hole is located in an intermediate portion of the short side.

7. The electronic device according to claim 5, wherein at least one of the first member and the second member includes a check hole for checking a state of filling with the sealant, separately from the through hole.

8. The electronic device according to claim 7, wherein the check hole is located around each vertex of a rectangle.

9. A method of manufacturing an electronic device comprising:
preparing an extending member which extends to connect a first region and a second region to each other and includes a first planar surface and a second planar surface facing away from each other;
locating the extending member in a first member such that the first member is immovably fixed to the first planar surface of the extending member;
surrounding a certain section of the extending member with a gap from the extending member being located in part by combining a second member with the first member such that the second member is immovably fixed to the second planar surface of the extending member; and
watertightly separating the first region and the second region from each other by injecting a sealant into the gap through a through hole located in the first member which allows communication between the gap and outside.

* * * * *